(12) United States Patent
Kasai

(10) Patent No.: US 10,775,571 B2
(45) Date of Patent: Sep. 15, 2020

(54) OPTICAL MODULE

(71) Applicant: FUJIKURA LTD., Tokyo (JP)

(72) Inventor: Yohei Kasai, Chiba (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 16/486,411

(22) PCT Filed: Dec. 28, 2017

(86) PCT No.: PCT/JP2017/047285
§ 371 (c)(1),
(2) Date: Aug. 15, 2019

(87) PCT Pub. No.: WO2018/168166
PCT Pub. Date: Sep. 20, 2018

(65) Prior Publication Data
US 2020/0110231 A1 Apr. 9, 2020

(30) Foreign Application Priority Data

Mar. 15, 2017 (JP) ................................ 2017-050055

(51) Int. Cl.
*G02B 6/42* (2006.01)
*H01S 5/022* (2006.01)
(Continued)

(52) U.S. Cl.
CPC ......... *G02B 6/4206* (2013.01); *G02B 6/4214* (2013.01); *G02B 19/0028* (2013.01);
(Continued)

(58) Field of Classification Search
None
See application file for complete search history.

(56) References Cited

U.S. PATENT DOCUMENTS 6,124,973 A 9/2000 Du et al.
9,455,552 B1 * 9/2016 Price ................... H01S 5/02292
(Continued)

FOREIGN PATENT DOCUMENTS

CN 104704410 A 6/2015
CN 105514794 A 4/2016
(Continued)

OTHER PUBLICATIONS

International Search Report issued in corresponding International Application No. PCT/JP2017/047285 dated Mar. 6, 2018 (3 pages).
Decision of Refusal issued in corresponding Japanese Patent Application No. JP2017-050055 dated Oct. 23, 2018 (7 pages).

*Primary Examiner* — Michelle R Connelly
(74) *Attorney, Agent, or Firm* — Osha Liang LLP

(57) ABSTRACT

An optical module including: a plurality of light emitting elements disposed on a same plane; a plurality of mirrors that reflect each light emitted from each of the plurality of light emitting elements; and a condenser lens into which each of the lights reflected by the plurality of mirrors enters. The plurality of mirrors reflects each of the lights emitted from each of the plurality of light emitting elements in a direction inclined with respect to a plane and aligns the light in a fast axis direction. Each of the lights emitted from the plurality of light emitting elements is reflected by the plurality of mirrors away from one another in the fast axis direction and is condensed at one point to reduce an aberration of light compared to a case where each of the lights enters into the condenser lens while propagating parallel to one another.

8 Claims, 5 Drawing Sheets

(51) Int. Cl.
*G02B 19/00* (2006.01)
*H01S 5/40* (2006.01)
*G02B 27/09* (2006.01)
*H01S 5/00* (2006.01)

(52) U.S. Cl.
CPC ..... *G02B 19/0057* (2013.01); *G02B 27/0905* (2013.01); *H01S 5/0071* (2013.01); *H01S 5/022* (2013.01); *H01S 5/02248* (2013.01); *H01S 5/02284* (2013.01); *H01S 5/4012* (2013.01); *G02B 6/4267* (2013.01); *G02B 27/0922* (2013.01); *G02B 27/0955* (2013.01); *G02B 27/0977* (2013.01)

(56) References Cited

U.S. PATENT DOCUMENTS

| | | |
|---|---|---|
| 2009/0245315 A1 | 10/2009 | Faybishenko |
| 2013/0194801 A1 | 8/2013 | Wolf et al. |
| 2015/0280404 A1 | 10/2015 | Kasai et al. |

FOREIGN PATENT DOCUMENTS

| | | | |
|---|---|---|---|
| EP | 2940503 A1 * | 11/2015 | ............ G02B 27/12 |
| JP | 2004-029335 A | 1/2004 | |
| JP | 2012-168240 A | 9/2012 | |
| JP | 2015-072956 A | 4/2015 | |
| JP | 2015-148810 A | 8/2015 | |
| JP | 2016-224376 A | 12/2016 | |
| WO | 2014/103451 A1 | 7/2014 | |

\* cited by examiner

OPTICAL MODULE

TECHNICAL FIELD

The present invention relates to an optical module.

BACKGROUND

There is known one of optical modules that emit light from laser diodes through an optical fiber. In this optical module, the optical fiber is led out from inside to outside a housing. In the housing, optical components such as the laser diodes, mirrors, a lens, and the optical fiber are arranged. The light emitted from each the laser diodes is condensed and entered into the optical fiber, and is emitted from the optical fiber to the outside of the housing.

For example, Patent Literature 1 below discloses an optical module that includes: a plurality of laser diodes arranged on a stepped mount; mirrors provided corresponding to each of the laser diodes; and a condenser lens that condenses light reflected by each of the mirrors and enters the light into the optical fiber.

Patent Literature 2 below discloses an optical module that includes: a plurality of laser diodes arranged on the same plane; a collimator that collimates light emitted from each of the laser diodes; and diffraction gratings that change the direction of the collimated light; and a condenser lens that condenses the light redirected by each of the diffraction gratings and enters the light into the optical fiber. The laser diodes included in such an optical module are formed by laminating semiconductor layers in a direction perpendicular to the plane on which the laser diodes are arranged. Accordingly, the light emitted from the laser diodes has a slow axis direction parallel to the plane on which the plurality of laser diodes is arranged. In addition, in the optical module described in Patent Literature 2 below, light propagates from each of the laser diodes to the condenser lens in a plane parallel to the plane on which the plurality of laser diodes is arranged. Therefore, in this optical module, the light emitted from the plurality of laser diodes is incident on the condenser lens in parallel to the slow axis direction.

[Patent Literature 1] U.S. Pat. No. 6,124,973
[Patent Literature 2] JP 2015-72956 A In the optical module as described above, the heat emitted by the laser diodes is transferred to a heat sink via the mount. When a plurality of laser diodes is arranged on a stepped mount as in the optical module described in Patent Literature 1, there occurs a difference in the length of a heat radiation path among the laser diodes. Therefore, the junction temperature is likely to be different among the laser diodes. If there is a difference in the junction temperature among the laser diodes, the laser diodes vary in lifespan, and thus the reliability designing of the optical module may become complicated.

Further, in the optical module described in Patent Literature 2, the light emitted from the plurality of laser diodes is aligned in the slow axis direction as described above. However, the light emitted from the laser diodes is less likely to be collimated in the slow axis direction than in a fast axis. Therefore, in the optical module described in Patent Literature 2, the light emitted from the plurality of laser diodes is hard to condense in a narrow area, which makes it difficult to achieve high output power.

SUMMARY

One or more embodiments of the present invention provide an optical module that is capable of emitting light of high output power while suppressing the complexity of reliability designing.

The optical module according to one or more embodiments of the present invention includes: a plurality of light emitting elements arranged on the same plane; and a plurality of mirrors that reflect each light emitted from each of the light emitting elements. The plurality of mirrors reflects each light emitted from each of the light emitting elements in a direction inclined with respect to the plane and aligns the light in a fast axis direction.

In the optical module described above, arranging each of the light emitting elements on the same plane makes it easy to unify the lengths of the heat radiation paths of the heat released from each of the light emitting elements. Accordingly, in the optical module, it is possible to suppress differences in junction temperature among each of the light emitting elements, thereby suppressing the complexity of the reliability designing. Further, in the optical module, the light emitted from the plurality of light emitting elements can be aligned in the fast axis direction by reflection, whereby the light emitted from the plurality of light emitting elements can be condensed in a spatially dense manner. Accordingly, the optical module can emit light of high output power.

In addition, an angle θ formed by a direction in which each light emitted from each of the light emitting elements is incident on each of the mirrors and a direction in which the light is reflected and emitted by each of the mirror may be larger than 0° and smaller than 90°.

Thus, each light emitted from each of the light emitting elements is reflected at a predetermined angle, whereby the light emitted from the plurality of light emitting elements can be easily aligned in the fast axis direction by reflection.

In addition, the light reflected by at least one of the mirrors may overlap at least another of the mirrors in the fast axis direction.

Propagating the light reflected by the mirrors in such a manner as to overlap another mirror makes it possible to achieve the downsizing of the optical module by narrowing the space between the light emitting elements and the mirrors, and the like.

Further, the light reflected by each of the mirror may be reflected in the direction in which the plurality of mirrors is aligned in parallel as viewed from the fast axis direction of the light incident on each of the mirrors.

Reflecting the light by each of the mirrors in this manner makes it possible to suppress each light reflected by each of the mirrors from being displaced from one another in the slow axis direction. Accordingly, each light reflected by each of the mirrors can be condensed in a narrow area.

In one or more embodiments, the plurality of mirrors may reflect each light emitted from each of the light emitting elements such that propagation directions of the light become parallel to one another.

Reflecting the light in this manner makes it easy to obtain high combining efficiency when the light is condensed by the condenser lens and entered into the optical fiber.

Alternatively, the optical module may further include a condenser lens into which the light reflected by the plurality of mirrors is entered, and that each light emitted from each of the light emitting elements is reflected by the plurality of mirrors in such a manner as to come closer to one another in the fast axis direction, and is condensed at one point by the condenser lens.

Condensing the light reflected to come closer to one another by the condenser lens makes it easy to bring the focal position closer to the condenser lens. This achieves the downsizing of the optical module.

Alternatively, the optical module may further include a condenser lens into which the light reflected by the plurality of mirrors is entered, and that each light emitted from each of the light emitting elements is reflected by the plurality of mirrors in such a manner as to be away from one another in the fast axis direction, and is condensed at one point by the condenser lens.

Accordingly, when the light reflected by the plurality of mirrors in such a manner as to be away from one another is entered into the condenser lens, the entrance angle of the light entered at a position of the outer peripheral side of the condenser lens, that is, a position separated from the optical axis of the condenser lens can be increased. Entering the light into the condenser lens as described above makes it possible to reduce the aberration of the light condensed by the condenser lens.

In one or more embodiments, the optical module may further include a condenser lens into which the light reflected by the plurality of mirrors is entered; and a light refraction member that is arranged between the plurality of mirrors and the condenser lens, and that the light refraction member refracts the light such that propagation directions of each light reflected by the plurality of mirrors come closer to be parallel to an optical axis of the condenser lens.

Providing such a light refraction member makes it easy to enter light parallel to the optical axis of the condenser lens into the condenser lens, even when the propagation directions of the light reflected by the mirrors and the optical axis of the condenser lens are not parallel. Accordingly, it is possible to improve the degree of freedom of design and arrangement of the condenser lens for condensing the light reflected by the plurality of mirrors.

Alternatively, the optical module may further include a condenser lens into which the light reflected by the plurality of mirrors is entered, and that the condenser lens is arranged such that an incident direction of the light in a center of an area into which the light reflected by the plurality of mirrors is entered and the optical axis of the condenser lens are parallel to each other.

Arranging the condenser lens in this manner makes it easy to enter the light parallel to the optical axis into the condenser lens without using the light refraction member as described above.

In one or more embodiments, the optical module may further include an optical fiber into which the light reflected by the plurality of mirrors is entered, and that an end face of the optical fiber on the side into which the light is entered has an inclined surface that refracts the light such that a propagation direction of the light entered into the optical fiber comes closer to a direction parallel to the optical axis of the optical fiber.

Forming the inclined surface on the end face of the optical fiber makes it possible to bring the propagation direction of the light propagating through a core of the optical fiber closer to the direction parallel to the optical axis of the optical fiber. This can suppress leakage of the light from the core.

In one or more embodiments, each of the mirrors may have a fixed surface that is fixed to another member, and the fixed surface is parallel to a surface of the other member to which the mirror is fixed.

Forming the fixed surfaces of the mirrors makes it possible to set an adhesive for fixing the fixed surfaces of the mirrors and the other member to a uniform thickness. This makes it possible to suppress the reflective surfaces of the mirrors from inclining when the volume of the adhesive varies due to a change in temperature or humidity, and the like. This can suppress a change in the reflection direction of the light by the mirrors.

As described above, according to one or more embodiments of the present invention, it is possible to provide an optical module capable of emitting light of high output power while suppressing complexity of reliability designing.

DETAILED DESCRIPTION

Hereinafter, embodiments of an optical module according to the present invention will be described in detail with reference to the drawings.

Figure 1:
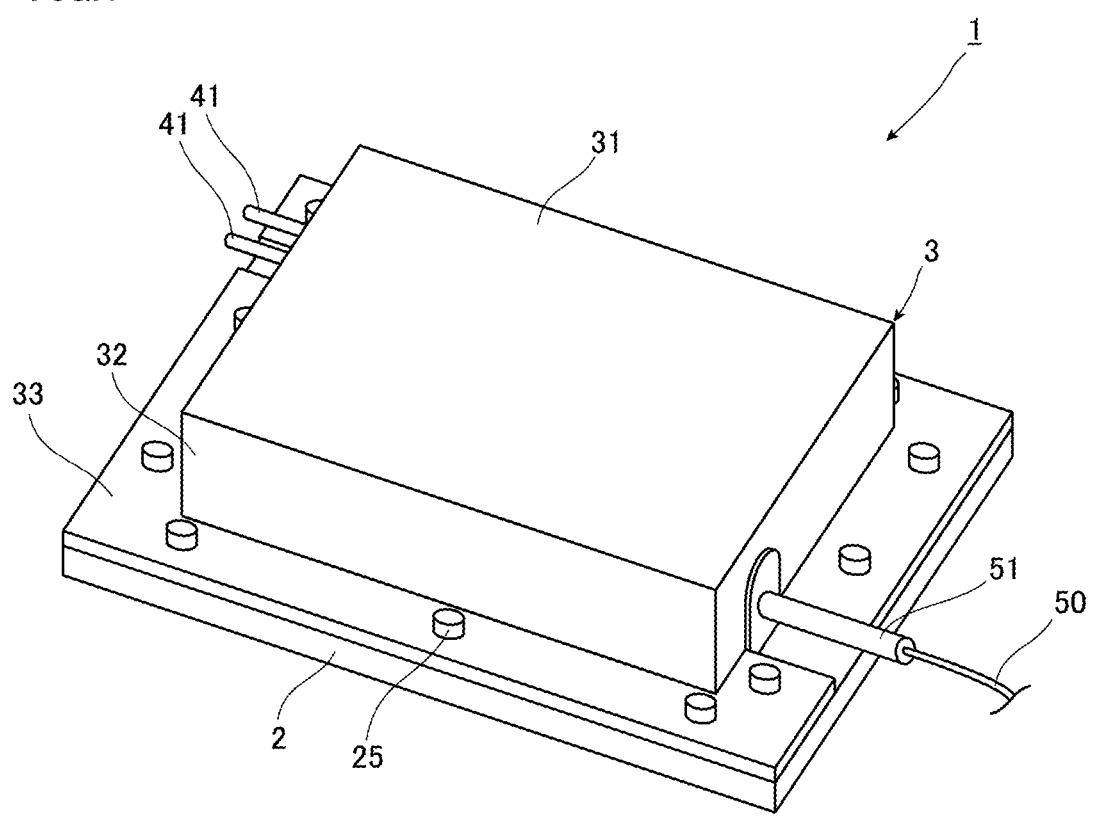
FIG. 1 is a perspective view of an optical module according to one or more embodiments of the present invention.

FIG. 1 is a perspective view of an optical module according to one or more embodiments. As illustrated in FIG. 1, the optical module 1 of one or more embodiments includes a housing formed from a base plate 2 and a lid 3, optical components fixed in the housing, which will be described later, and a connector 41 that supplies power to some of the optical components.

Figure 2:
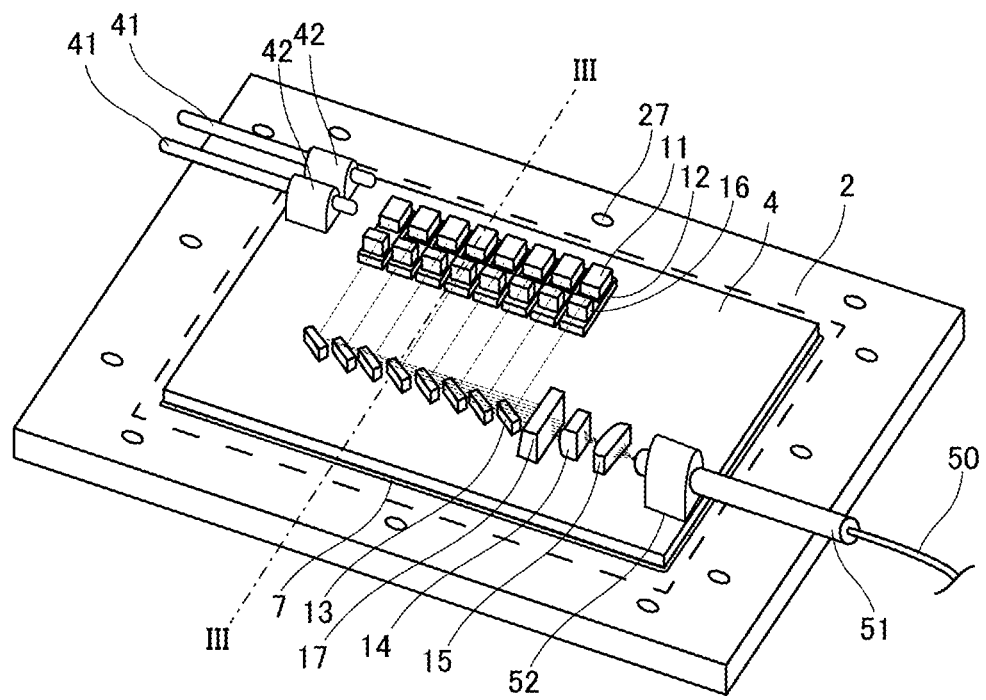
FIG. 2 is a diagram illustrating the optical module illustrated in FIG. 1 from which a lid is removed.
Figure 3:
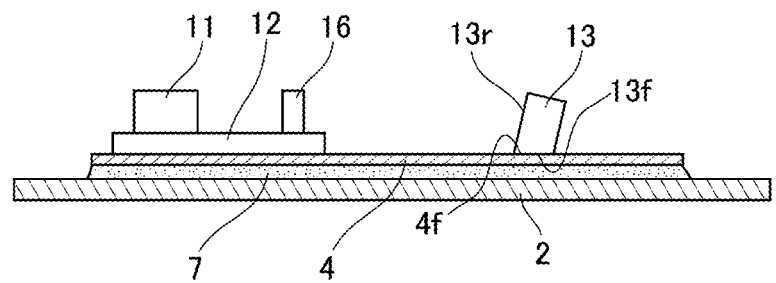
FIG. 3 is a cross-sectional view of the optical module taken along a line III-III illustrated in FIG. 2.

FIG. 2 is a diagram illustrating the optical module 1 illustrated in FIG. 1 from which the lid 3 is removed. In FIG. 2, paths of light emitted from laser diodes 11 is shown by broken lines. FIG. 3 is a cross-sectional view of the optical module 1 taken along a line III-III illustrated in FIG. 2.

The base plate 2 is a plate of which a bottom surface constituting a bottom plate of the housing is flat. In one or more embodiments, the base plate 2 is a flat plate member as illustrated in FIGS. 2 and 3. The base plate 2 is made of metal. Examples of the metal constituting the base plate 2 include copper, stainless steel, and so on. The base plate 2 has a plurality of screw holes 27 formed at an outer peripheral portion.

A sub-mount 4 is fixed on the base plate 2 by solder 7. The sub-mount 4 is a flat substrate and is made of a material smaller in linear expansion coefficient than the base plate 2. For example, when the base plate 2 is made of copper, the sub-mount 4 is made of aluminum nitride. The sub-mount 4 is made of a material with a small linear expansion coefficient as described above, which makes it possible to suppress a change in optical properties of the optical module 1 resulting from the expansion of the sub-mount 4 due to heat generated by the optical components arranged on the sub-mount 4.

The optical components including an optical fiber 50 are fixed on the sub-mount 4. The optical components of one or more embodiments include laser diodes 11 as light emitting elements, collimator lenses 16, mirrors 13, a light refraction member 17, first and second condenser lenses 14 and 15 as condenser lenses, and the optical fiber 50.

Each of the laser diodes 11 is an element of a Fabry-Perot structure in which a plurality of semiconductor layers including an active layer is stacked, and emits laser light with a wavelength of 900 nm, for example. Each of the laser diodes 11 is arranged on the same plane. In one or more embodiments, the plurality of laser diodes 11 is arranged such that the active layers of each of the laser diodes 11 overlap with one virtual plane. In one or more embodiments, each of the laser diodes 11 is fixed on a laser mount 12 by soldering or the like, and is fixed on the sub-mount 4 with the laser mount 12 therebetween. The laser mounts 12 are stages for adjusting the heights of the laser diodes 11. Each of the laser mounts 12 is fixed by soldering, for example, at a position on the outer peripheral side of the sub-mount 4. The laser mounts 12 may be separated from the sub-mount 4 and fixed on the sub-mount 4 as described above, or the laser mounts 12 may be integrally molded with the sub-mount 4. Alternatively, when there is no need to adjust the heights of the laser diodes 11, the laser mounts 12 may be omitted.

The collimator lenses 16 are arranged on the laser mounts 12 corresponding to each of the laser diodes 11. The collimator lenses 16 are lenses for collimating light in the fast axis direction and light in the slow axis direction of light emitted from the laser diodes 11. The collimator lenses 16 are generally formed from a combination of lenses for collimating the light in the fast axis direction and lenses for collimating the light in the slow axis direction. The collimator lenses 16 are fixed on the laser mounts 12 together with the laser diodes 11 by bonding or the like. When the laser mounts 12 are omitted as described above, the collimator lenses 16 are fixed on the sub-mount 4 together with the laser diodes 11.

Each of the mirrors 13 is provided on the light emission direction side of the corresponding laser diode 11. One mirror 13 is provided for one laser diode 11. Thus, the mirrors 13 can directly reflect the light emitted from the laser diodes 11 and collimated. In one or more embodiments, the plurality of mirrors 13 is aligned in parallel to the alignment direction of the plurality of laser diodes 11.

As illustrated in FIG. 3, each of the mirrors 13 has a reflective surface 13r that reflects the light from the corresponding laser diode 11 and a fixed surface 13f that is fixed to the sub-mount 4. In each of the mirrors 13, the angle formed by the reflective surface 13r and the fixed surface 13f is an acute angle. Accordingly, the mirrors 13 are arranged such that the fixed surfaces 13f are parallel to a surface 4f of the sub-mount 4, whereby the reflective surfaces 13r are inclined with respect to the normal to the surface 4f of the sub-mount 4. Each of the mirrors 13 has the reflective surface 13r inclined as described above, and the plurality of mirrors 13 can reflect each light emitted from each of the laser diodes 11 such that the light is aligned in the fast axis direction, as described later in detail. In one or more embodiments, the plurality of mirrors 13 is arranged such that it is possible to suppress the light reflected by each of the mirrors 13 from being blocked by the other mirrors 13.

For example, 95% or more of the light reflected by each of the mirrors 13 may not be blocked by the other mirrors 13.

Each of the mirrors 13 of one or more embodiments is a glass body that has the reflective surface 13r formed by a reflective film made of a dielectric multilayer film, for example, and has the fixed surface 13f fixed to the surface 4f of the sub-mount 4 with an adhesive. Each of the mirrors 13 is obtained by obliquely cutting the surface of a rectangular glass body on the side where the fixed surface 13f is to be formed and then forming a reflective film on the cut surface, for example. Each of the reflective surfaces 13r may be formed of a metal film. Each of the mirrors 13 may be formed of a prism.

The light refraction member 17 is provided between the plurality of mirrors 13 and the first condenser lens 14 and is fixed to the sub-mount 4 by bonding. The light refraction member 17 refracts the light so that the propagation directions of each light reflected by the plurality of mirrors 13 approach in parallel to the optical axis of the first condenser lens 14. The light refraction member 17 of one or more embodiments has a surface on the mirrors 13 side and a surface on the first condenser lens side in non-parallel to each other. The light refraction member 17 has a bottom surface fixed to the sub-mount 4. The surface of the light refraction member 17 on the first condenser lens 14 side is formed perpendicularly to the bottom surface, and the surface of the light refraction member 17 on the mirror 13 side is formed so that the angle formed with the bottom surface is acute. Therefore, in a state where the bottom surface of the light refraction member 17 is fixed in parallel to the surface 4f of the sub-mount 4, the distance at which the light reflected by the plurality of mirrors 13 enters and passes through the light refraction member 17 becomes smaller with decreasing proximity to the sub-mount 4. The light refraction member 17 is a wedge substrate and is made of glass, for example.

Each of the first condenser lens 14 and the second condenser lens 15 is formed from a cylindrical lens, and is fixed to the sub-mount 4 by bonding. The first condenser lens 14 condenses the light reflected by each of the mirrors 13 in the fast axis direction, and the second condenser lens 15 condenses the light emitted from the first condenser lens 14 in the slow axis direction. In one or more embodiments, the first condenser lens 14 and the second condenser lens 15 are disposed such that the optical axis of the first condenser lens 14 and the optical axis of the second condenser lens 15 are parallel to the plane on which the plurality of laser diodes 11 is arranged. Further, in one or more embodiments, the first condenser lens 14 and the second condenser lens 15 are arranged such that the optical axis of the first condenser lens 14 and the optical axis of the second condenser lens 15 are placed in a straight line. Further, the first condenser lens 14 is disposed such that the incident direction of the light in the center of an area where the light reflected by the plurality of mirrors 13 enters via the light refraction member 17 and the optical axis of the first condenser lens 14 are parallel to each other. When the light emitted from these condenser lenses is not condensed at a set position, another condenser lens may be further disposed on the sub-mount 4.

The optical fiber 50 is inserted into a pipe-shaped holder 51 and fixed to the holder 51. In one or more embodiments, one end of the optical fiber 50 as the light inlet end of the optical fiber 50 is slightly led out from the holder 51. The holder 51 is fixed to a fiber mount 52, and the fiber mount 52 is fixed to the sub-mount 4. The one end of the optical fiber 50 is located at a position where the light emitted from the second condenser lens 15 can enter the core. In one or more embodiments, the optical fiber 50 is disposed such that the optical axis of the optical fiber 50 is parallel to the plane on which the plurality of laser diodes 11 is arranged. In one or more embodiments, the optical fiber 50 is fixed to the holder 51 by an adhesive or soldering, the holder 51 is fixed to the fiber mount 52 by bonding, and the fiber mount 52 is fixed to the sub-mount 4 by bonding.

The connector 41 is formed from a pair of rod-like conductors, and each of the conductors is fixed to a pair of connector holders 42. Each of the connector holders 42 is bonded and fixed to the sub-mount 4. One conductor of the connector 41 is connected to the laser diode 11 closest to the connector 41 by a gold wire (not illustrated). Each of the laser diodes 11 is daisy-chained by a gold wire (not illustrated). The other conductor of the connector 41 is connected to the laser diode 11 farthest from the connector 41 by a gold wire (not illustrated).

The lid 3 is formed by pressing a metal plate and includes a top plate 31, a frame 32, and a collar 33 as illustrated in FIG. 1. The top plate 31 is a portion that constitutes the top plate of the housing and is formed of a flat plate-like member. The frame 32 is a portion vertically connected to the top plate 31 at the periphery of the top plate 31. The frame 32 is sized to surround the sub-mount 4 and the optical components on the sub-mount 4 in a state in which the lid 3 is disposed on the base plate 2. Further, the frame 32 and the collar 33 have a cutting portion for leading out the optical fiber 50 from inside to outside the housing, and a cutting portion for leading out the connector 41 from inside to outside the housing. Further, the collar 33 has a plurality of screw holes. Screws 25 are screwed into these screw holes and each of the screw holes 27 in the base plate 2, whereby the base plate 2 and the lid 3 are fixed to each other.

Next, optical operations of the optical module 1 will be described.

When a set power is supplied from the connector 41 to each of the laser diodes 11, each of the laser diodes 11 emits light toward each of the collimator lens 16 corresponding to each of the laser diodes 11 as illustrated in FIG. 2. The light is a laser beam with a wavelength of 900 nm, for example, as described above. The light emitted from each of the laser diodes 11 has the fast axis direction orthogonal to the plane on which the plurality of laser diodes 11 is arranged, and has the slow axis direction parallel to the direction in which the plurality of laser diodes 11 is aligned in parallel.

Each of the collimator lenses 16 collimates the light emitted from the corresponding laser diode 11 and emits the same. The light emitted from each of the collimator lenses 16 enters the corresponding mirror 13. Each of the mirrors 13 reflects the incident light as described below.

Figure 4:
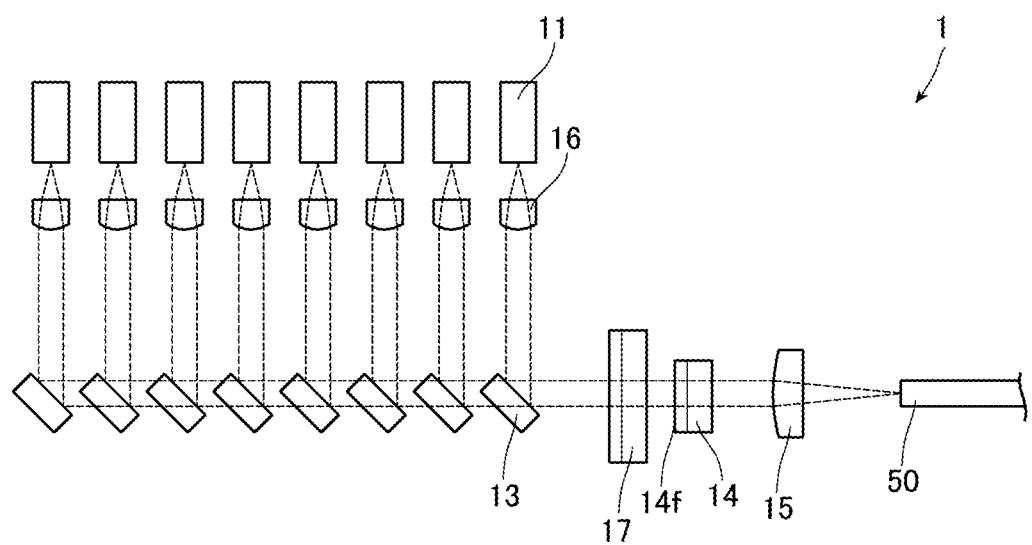
FIG. 4 is a plan view illustrating optical paths of light reflected by mirrors illustrated in FIG. 2.
Figure 5:
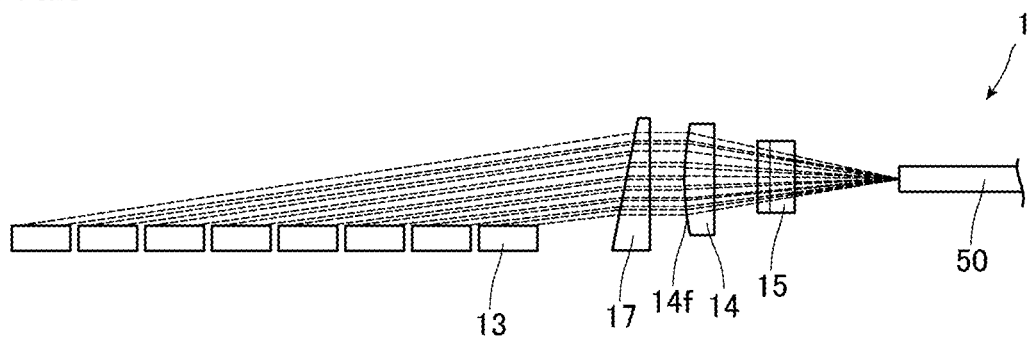
FIG. 5 is a side view illustrating optical paths of the light reflected by the mirrors illustrated in FIG. 2.

FIG. 4 is a plan view illustrating optical paths of the light reflected by the mirrors 13 illustrated in FIG. 2. FIG. 5 is a side view illustrating the optical paths of the light reflected by the mirrors 13 illustrated in FIG. 2. FIGS. 4 and 5 schematically illustrate only some of the members provided in the optical module 1, where the optical paths of the light emitted from each of the laser diodes 11 are shown by broken lines. Each of the first condenser lens 14 and the second condenser lens 15 is fixed to the sub-mount 4 with a pedestal (not illustrated) therebetween.

In one or more embodiments, the light reflected by each of the mirrors 13 is reflected in the direction in which the plurality of mirrors 13 is aligned in parallel as viewed from the fast axis direction of the light incident on each of the mirrors 13. The reflective surfaces 13r of the mirrors 13 of one or more embodiments are inclined as described above. The plurality of mirrors 13 can reflect each light emitted from each of the laser diodes 11 in a direction inclined to the plane on which the laser diodes 11 are arranged, that is, the surface 4f of the sub-mount 4. The angle θ formed by the direction in which each light emitted from each of the laser diodes 11 enters each of the mirrors 13 and the direction in which the light is reflected and emitted by each of the mirrors 13 is larger than 0° and smaller than 90°. Accordingly, as illustrated in FIGS. 4 and 5, the light reflected by each of the mirrors 13 propagates through a space on the side opposite to the sub-mount 4 of the adjacent mirror 13 disposed on the first condenser lens 14 side. In this manner, the plurality of mirrors 13 can reflect each light emitted from each of the laser diodes 11 so that each light is aligned with each other in the fast axis direction. Furthermore, in one or more embodiments, the plurality of mirrors 13 reflects each light emitted from each of the laser diodes 11 so that the propagation directions of the light become parallel to each other. That is, when the light emitted from each of the laser diodes 11 is parallel to one another, the reflective surfaces 13r of each of the mirrors 13 have substantially the same angle with respect to the surface 4f of the sub-mount 4.

The light reflected by the plurality of mirrors 13 as described above enters the light refraction member 17. The light incident on the light refraction member 17 is refracted so that the propagation directions of each light reflected by the plurality of mirrors 13 approach in parallel to the optical axis of the first condenser lens 14 as illustrated in FIG. 5. Therefore, the light substantially parallel to the optical axis enters the first condenser lens 14.

Figure 6:
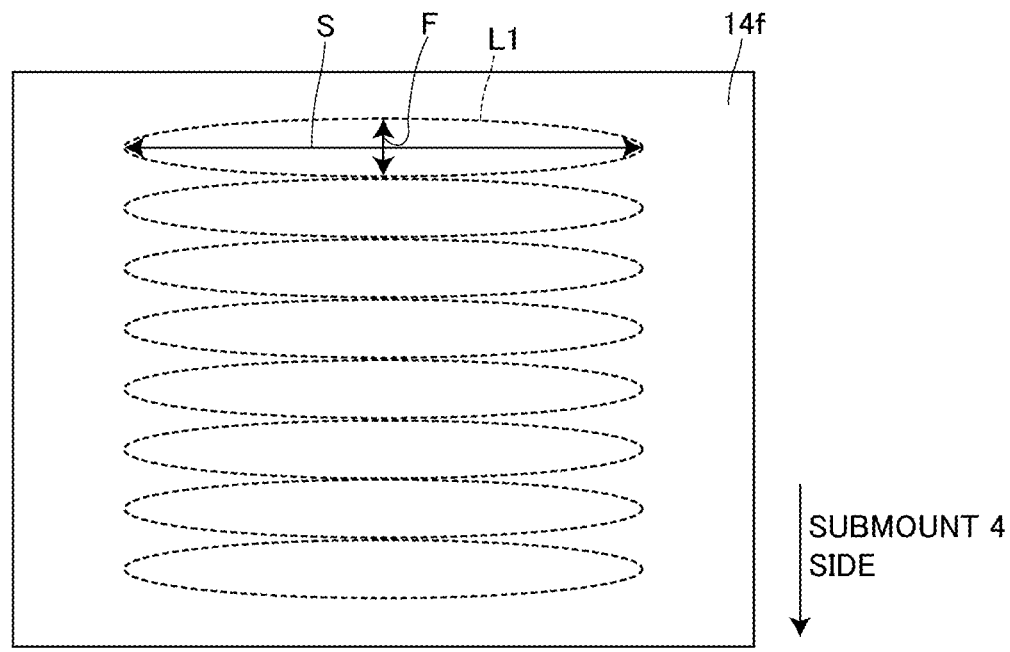
FIG. 6 is a diagram illustrating spread of light entered into an entrance surface of a condenser lens illustrated in FIG. 2.

FIG. 6 is a diagram illustrating the spread of light incident on an entrance surface 14f of the first condenser lens 14 illustrated in FIG. 2. Each light L1 emitted from the plurality of laser diodes 11 is aligned so that fast axes of the light are aligned with one another by the reflection of the plurality of mirrors 13 as described above. Therefore, when the light L1 enters the entrance surface 14f of the first condenser lens 14, each light L1 is aligned in a fast axis F direction. In each of the collimator lens 16, the light, which is emitted from the corresponding laser diode 11 and spreads in the fast axis F direction, is easy to collimate due to a single mode. The light, which is emitted from the corresponding laser diode and spreads in a slow axis S direction, is hard to collimate as compared to the light spreading in the fast axis F direction due to a multi-mode. Accordingly, as illustrated in FIG. 6, the light L1 incident on the first condenser lens 14 is smaller in spread in the fast axis F direction than in the slow axis S direction.

The light incident on the first condenser lens 14 is condensed in the fast axis direction as described above. The light emitted from the first condenser lens 14 enters the second condenser lens 15, and is condensed by the second condenser lens 15 in the slow axis direction of the light. The light condensed by the second condenser lens 15 enters the core of the optical fiber 50 and propagates through the optical fiber 50. Thus, the light is emitted from the other end of the optical fiber 50.

Next, operations of the optical module 1 will be described.

As described above, the optical module 1 includes the laser diodes 11 as a plurality of light emitting elements arranged on the same plane, and the plurality of mirrors 13 provided on the light emission direction side of the plurality of laser diodes 11. As described above, in the optical module 1, each of laser diodes 11 is arranged on the same plane so that the lengths of the radiation paths of the heat emitted from each of the laser diodes 11 can be easily aligned. Accordingly, the optical module 1 can suppress the occurrence of a difference in the junction temperatures among each of the laser diodes 11, thereby suppressing the complexity of the reliability designing.

Further, as described above, the plurality of mirrors reflects each light emitted from each of the laser diodes 11 such that the light is aligned in the fast axis direction. The light emitted from the laser diodes 11 is easy to collimate in the fast axis direction as compared to in the slow axis direction as described above. Accordingly, the light emitted from the plurality of laser diodes 11 and collimated is aligned in the fast axis direction, whereby it is easy to condense the light in a spatially dense manner. Thus, in the optical module 1, the light emitted from the plurality of laser diodes 11 can be condensed in a spatially dense manner. That is, the optical module 1 can emit light of high output power. Therefore, in the optical module 1, the multiplexed high-intensity light can propagate through the optical fiber 50.

In a mode in which a plurality of light emitting elements is arranged on a stepped mount as in Patent Literature 1, when light emitted from each of the light emitting elements is reflected by a plurality of mirrors such that the light is aligned in the fast axis direction, the space between each light depends on the processing accuracy of the steps. For example, when the dimensional tolerance of the steps is large, the binding efficiency becomes lowered. However, it is difficult to manufacture a stepped mount or the like at low cost and with high accuracy. On the other hand, in the optical module 1 of one or more embodiments, the sub-mount 4 on which the plurality of laser diodes 11 is arranged can be flat, which facilitates the formation of the sub-mount 4 at low cost and with high accuracy.

In the optical module 1, the light is reflected by each of the mirrors 13 in the direction in which the plurality of mirrors 13 is aligned in parallel when viewed from the fast axis direction of the light incident on each of the mirrors 13. The light is reflected by each of the mirrors 13 as described above so that it is possible to suppress each light reflected by each of the mirrors 13 from being displaced from one another in the slow axis direction. Accordingly, each light reflected by each of the mirrors 13 can be condensed in a narrow area.

In the optical module 1, it is possible to suppress the light reflected by each of the mirrors 13 from being blocked by the other mirrors 13. The light is reflected by each of the mirrors 13 as described above so that the light emitted from the plurality of laser diodes 11 can be efficiently used. Accordingly, the light emitted from the plurality of laser diodes 11 can efficiently enter the optical fiber 50.

In the optical module 1, the light refraction member 17, which refracts the light such that the propagation directions of each light reflected by the plurality of mirrors 13 approach in parallel to the optical axis of the first condenser lens 14, is provided between the plurality of mirrors 13 and the first condenser lens 14. Providing such a light refraction member 17 makes it easy to enter the light parallel to the optical axis of the first condenser lens 14 into the first condenser lens 14, even when the propagation directions of the light reflected by the mirrors 13 and the optical axis of the first condenser lens 14 are not parallel. Accordingly, it is possible to improve the freedom degree of designing and disposition of the first condenser lens 14 for condensing the light reflected by the plurality of mirrors 13. In addition, using such a light refraction member 17 makes it possible to arrange the first condenser lens 14, the second condenser lens 15, and the optical fiber 50 so that the optical axes are parallel to the plane on which the plurality of laser diodes 11 is arranged. This facilitates the manufacture of the optical module 1.

The mirrors 13 have the fixed surfaces 13f fixed to the sub-mount 4 as another member, and the fixed surfaces 13f are parallel to the surface 4f of the sub-mount 4 to which the mirrors 13 are fixed. Forming the fixed surfaces 13f of the mirrors 13 in this manner makes it possible to set an adhesive for fixing the fixed surfaces 13f of the mirrors 13 and the sub-mount 4 to a uniform thickness. Accordingly, it is possible to, when the volume of the adhesive changes due to a change in temperature or humidity, suppress inclination of the reflective surfaces 13r of the mirrors 13, and suppress a change in the reflection direction of the light by the mirrors 13.

In the optical module 1, arranging the plurality of laser diodes 11 on the same plane makes it possible to suppress the upsizing of the optical module 1 when the number of the laser diodes 11 to be arranged increases, as compared to a case where a plurality of laser diodes is arranged on a stepped mount. In the optical module 1, the alignment direction of the plurality of laser diodes 11 and the alignment direction of the plurality of mirrors 13 are parallel to each other. This makes it possible to suppress an increase in the area where the plurality of laser diodes and the plurality of mirrors 13 are arranged, as compared to a case where the alignment directions are not parallel. Accordingly, the upsizing of the optical module 1 can be suppressed.

Next, one or more embodiments of the present invention will be described in detail with reference to FIG. 7. It is to be noted that the same or equivalent constituent elements as those of one or more embodiments described above are denoted by the same reference signs, and redundant descriptions thereof will be omitted except when specified otherwise.

Figure 7:
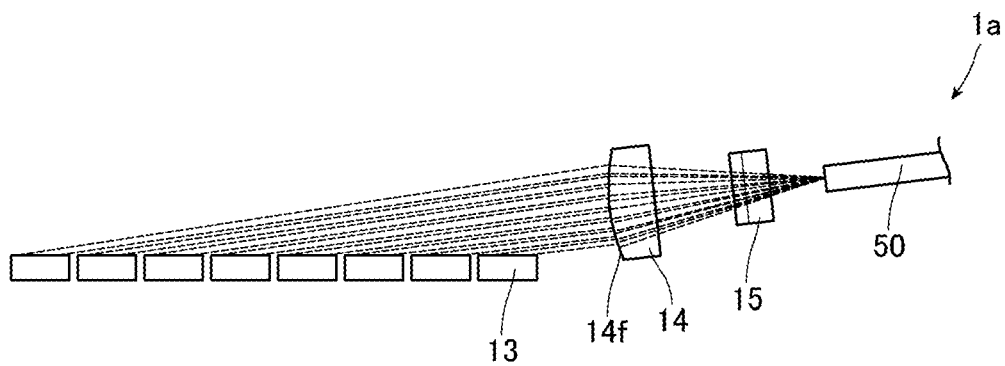
FIG. 7 is a diagram illustrating an optical module according to one or more embodiments of the present invention from the same viewpoint as FIG. 5.

FIG. 7 is a diagram illustrating an optical module according to one or more embodiments from the same viewpoint as FIG. 5. An optical module 1a of one or more embodiments is different from that in one or more embodiments described above in that the light refraction member 17 is not provided. In addition, one or more embodiments described below are also different from one or more embodiments described above in the arrangement of a first condenser lens 14, a second condenser lens 15, and an optical fiber 50 because the optical module 1a does not include the light refraction member 17. In one or more embodiments, optical axes of the first condenser lens 14, the second condenser lens 15, and the optical fiber 50 are inclined with respect to a surface on which a plurality of mirrors 13 is arranged. The optical axes of the first condenser lens 14, the second condenser lens 15, and the optical fiber 50 overlap in a straight line. In one or more embodiments, the first condenser lens 14 is disposed such that an incident direction of light reflected by the plurality of mirrors 13 in the center of an area where the light enters and the optical axis of the first condenser lens 14 are parallel to each other. Disposing the first condenser lens 14 in this manner makes it possible to enter the light parallel to the optical axis into the first condenser lens 14 without using the light refraction member 17 as described above.

Next, one or more embodiments of the present invention will be described in detail with reference to FIGS. 8 and 9. It is to be noted that the same or equivalent constituent elements as those of one or more embodiments described above are denoted by the same reference signs, and redundant descriptions thereof will be omitted except when specified otherwise.

Figure 8:
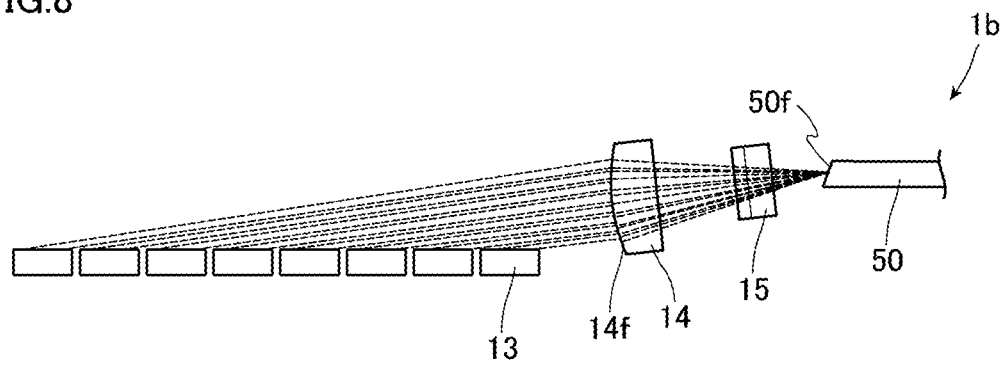
FIG. 8 is a diagram illustrating an optical module according to one or more embodiments of the present invention from the same viewpoint as FIG. 5.

FIG. 8 is a diagram illustrating an optical module according to one or more embodiments from the same viewpoint as FIG. 5. FIG. 9 is an enlarged cross-sectional view of an end portion of the optical fiber illustrated in FIG. 8. In FIG. 9, an arrow L2 indicates a propagation direction of light. An optical module 1b of one or more embodiments is different from that of one or more embodiments described above in the disposition of an optical fiber 50 and the shape of an incident end. The optical fiber 50 of one or more embodiments is arranged such that an optical axis of the optical fiber 50 is parallel to a plane on which a plurality of laser diodes 11 is arranged. An end face 50f of the optical fiber 50 on which light enters has an inclined surface that refracts the light so that the propagation direction of the light incident on the optical fiber 50 approaches in parallel to the optical axis of the optical fiber 50.

Figure 9:
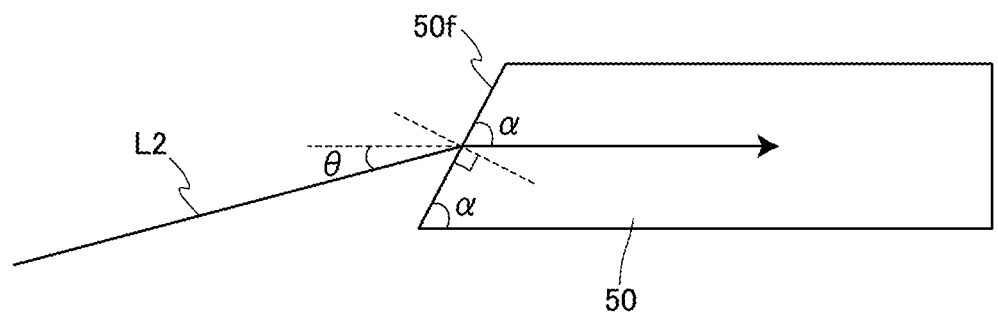
FIG. 9 is an enlarged cross-sectional view of an end portion of an optical fiber illustrated in FIG. 8.

For example, as illustrated in FIG. 9, Equation (1) below is satisfied where an inclination angle of the end face 50f with respect to the optical axis of the optical fiber 50 is α, an angle of the propagation direction of the light incident on the end face 50f with respect to the optical axis of the optical fiber 50 is θ, and a refractive index of core of the optical fiber 50 is n.

$$\sin(90-\alpha+\theta) = n \cdot \sin(90-\alpha) \quad (1)$$

Forming the end face 50f of the optical fiber 50 to have the inclined surface as described above makes it possible to bring the propagation direction of the light propagating through the core of the optical fiber 50 closer to a direction parallel to the optical axis of the optical fiber 50. This suppresses leakage of the light from the core.

Next, one or more embodiments of the present invention will be described in detail with reference to FIG. 10. It is to be noted that the same or equivalent constituent elements as those of one or more embodiments described above are denoted by the same reference signs, and redundant descriptions thereof will be omitted except when specified otherwise.

Figure 10:
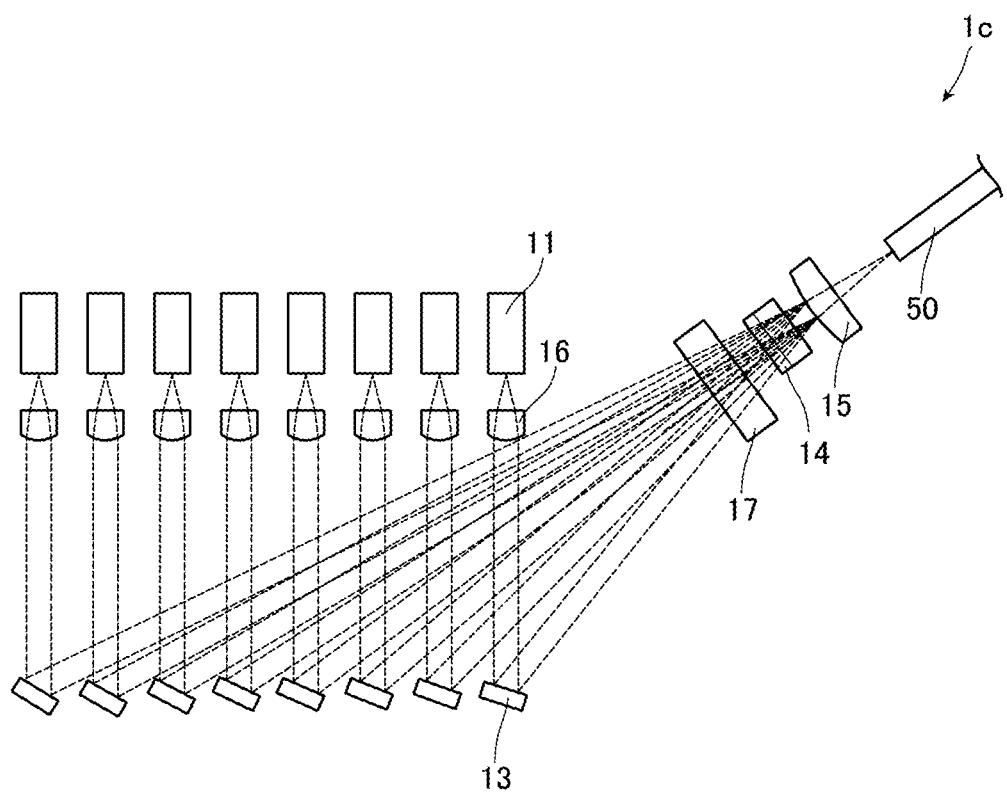
FIG. 10 is a diagram illustrating an optical module according to one or more embodiments of the present invention from the same viewpoint as FIG. 4.

FIG. 10 is a diagram illustrating an optical module according to one or more embodiments from the same viewpoint as FIG. 4. An optical module 1c of one or more embodiment is different from that of one or more embodiments described above in the direction of light reflected by each of mirrors 13. In addition, one or more embodiments described below are also different from one or more embodiments described above in the arrangement of a light refraction member 17, a first condenser lens 14, a second condenser lens 15, and an optical fiber 50 in accordance with the propagation directions of the light reflected by the mirrors 13. In one or more embodiments, each of the mirrors 13 is disposed such that the light reflected by each of the mirror 13 propagates between the adjacent mirror 13 on the first condenser lens 14 side and the corresponding laser diode 11.

The present invention has been described so far taking the foregoing embodiments as examples. However, the present invention is not limited to these embodiments.

For example, in one or more embodiments, the light reflected by each of the mirrors 13 propagates through the space on the side opposite to the sub-mount 4 of the adjacent mirror 13 disposed on the first condenser lens 14 side. However, in one or more embodiments, the plurality of mirrors 13 may be arranged such that the light reflected by each of the mirrors 13 propagates through the space on the laser diode 11 side with respect to the adjacent mirror 13 on the first condenser lens 14 side. The direction in which the light reflected by each of the mirrors 13 propagates is not limited to those in the foregoing embodiments. The light reflected by each of the mirrors 13 may propagate through the space in any direction with respect to the adjacent mirror 13 on the first condenser lens 14 side. For example, the sub-mount 4 may be formed from a transparent material or portions of the mirrors 13 on the sub-mount 4 side may be configured to transmit light so that the light reflected by each of the mirrors 13 propagates on the sub-mount 4 side of the adjacent mirror 13 on the first condenser lens 14 side. In addition, the light reflected by at least one of the mirrors 13 overlaps at least another of the mirrors 13 in the fast axis direction. Propagating the light reflected by each of the mirrors 13 in such a manner as to overlap another of the mirrors 13 makes it possible to narrow the space between the laser diodes 11 and the mirrors 13, thereby achieving the downsizing of the optical module.

In one or more embodiments, the light reflected by the plurality of mirrors 13 propagates in directions parallel to one another as an example. Reflecting the light in this manner makes it easy to obtain high combining efficiency when the light is condensed by the condenser lens and entered into the optical fiber. Alternatively, the plurality of mirrors 13 may reflect each light emitted from each of the laser diodes 11 to come closer to one another in the fast axis direction, and then the condenser lens may condense the light at one point. Condensing the light reflected to come closer to one another by the condenser lens makes it easy to bring the focal position closer to the condenser lens. This achieves the downsizing of the optical module.

The plurality of mirrors 13 may reflect each light emitted from each of the laser diodes 11 to be away from one another in the fast axis direction, and then the condenser lens may condense the light at one point. Accordingly, when the light reflected by the plurality of mirrors 13 in such a manner as to be away from one another enters the condenser lens, the entrance angle of the light entered at positions separated from the outer peripheral side of the condenser lens, that is, separated from the optical axis of the condenser lens can be increased. Entering the light into the condenser lens as described above makes it possible to reduce the aberration of the light condensed by the condenser lens.

In the foregoing embodiments, it is possible to suppress the light reflected by each of the mirrors 13 from being blocked by the other mirrors 13 as an example. However, the light reflected by at least some of each of the mirrors 13 may not be blocked by the other mirrors 13, and the light reflected by the others of the mirrors 13 may be blocked by the other mirrors 13. In addition, the light reflected by the mirrors 13 may partially overlap one another.

In one or more embodiments, as illustrated in FIG. 6, the light emitted from the plurality of laser diodes 11 and reflected by the plurality of mirrors 13 overlaps one another when viewed from the fast axis direction. However, the present invention is not limited to this mode. The light emitted from each of the light emitting elements is to be reflected by the plurality of mirrors to overlap part of the light emitted from at least another of the light emitting elements when viewed from the fast axis direction.

As described above, according to the present invention, it is possible to provide an optical module that is capable of emitting light of high output power while suppressing complexity of reliability designing. The optical module is usable in the technical fields of fiber laser devices and others, for example.

REFERENCE SIGNS LIST 1, 1a, 1b, 1c . . . optical module
2 . . . base plate
3 . . . lid
4 . . . sub-mount
4f . . . surface 11 ... laser diode
12 ... laser mount
13 ... mirror
13f ... fixed surface
13r ... reflective surface
14 ... first condenser lens
15 ... second condenser lens
17 ... light refraction member
50 ... optical fiber
50f ... end face

The invention claimed is:

1. An optical module comprising:
   a plurality of light emitting elements disposed on a same plane;
   a plurality of mirrors that reflects light emitted from each of the plurality of light emitting elements; and
   a condenser lens into which each of the reflected lights enters, wherein the plurality of mirrors reflects each of the emitted lights:
      in a direction inclined with respect to the plane on which the plurality of light emitting elements are disposed, and
      away from one another in a fast axis direction and aligned in the fast axis direction, such that the lights are spaced apart in the fast axis direction,
   each of the reflected lights enters the condenser lens and is condensed at one point with less aberration compared to a case where each of the lights enters the condenser lens while propagating parallel to one another.

2. The optical module according to claim 1, wherein the angle θ is larger than 0° and smaller than 90°, and the angle θ is formed by:
   a direction in which each of the emitted lights is incident on each of the plurality of mirrors, and
   a direction of reflection of each of the reflected lights.

3. The optical module according to claim 1, wherein one or more of the reflected lights reflected by one or more of the mirrors overlap at least another of the mirrors in the fast axis direction.

4. The optical module according to claim 1, wherein each of the reflected lights is reflected in a direction in which the plurality of mirrors is aligned in parallel when viewed from the fast axis direction of the emitted lights incident on each of the plurality of mirrors.

5. The optical module according to claim 1, further comprising:
   a light refraction member disposed between the plurality of mirrors and the condenser lens, wherein
   the light refraction member refracts the reflected lights such that propagation directions of each of the reflected lights come closer to one another and become parallel with an optical axis of the condenser lens.

6. The optical module according to claim 1, wherein the condenser lens is disposed such that an optical axis of the condenser lens is parallel with an incident direction of each of the reflected lights at a center of an area of the condenser lens where each of the reflected lights enters.

7. The optical module according to claim 1, further comprising:
   an optical fiber into which each of the reflected lights enters, wherein
   an end face of the optical fiber on a side into which each of the reflected lights enters has an inclined surface that refracts each of the reflected lights such that a propagation direction of each of the reflected lights becomes closer to a direction parallel to an optical axis of the optical fiber.

8. The optical module according to claim 1, wherein each of the plurality of mirrors has a fixed surface that is fixed to and in parallel with a surface of another member of the optical module.

* * * * *